(12) United States Patent
Matsui et al.

(10) Patent No.: US 7,416,942 B2
(45) Date of Patent: Aug. 26, 2008

(54) METHOD FOR MANUFACTURING SEMICONDUCTOR DEVICE

(75) Inventors: Yukiteru Matsui, Yokohama (JP); Shinichi Hirasawa, Tokyo (JP); Atsushi Shigeta, Fujisawa (JP); Kiyotaka Miyano, Tokyo (JP); Takeshi Nishioka, Yokohama (JP); Hiroyuki Yano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 7 days.

(21) Appl. No.: 11/708,532

(22) Filed: Feb. 21, 2007

(65) Prior Publication Data
US 2007/0224760 A1  Sep. 27, 2007

(30) Foreign Application Priority Data
Mar. 24, 2006  (JP)  .............................. 2006-082042

(51) Int. Cl.
*H01L 21/336* (2006.01)
*H01L 21/8238* (2006.01)
*H01L 21/461* (2006.01)

(52) U.S. Cl. .................... 438/257; 438/689; 438/637; 438/700; 438/201; 257/E21.23; 257/E21.304; 257/E21.548; 257/E21.645

(58) Field of Classification Search ................ 438/257, 438/689, 637, 700, 201; 257/E21.23, E21.304, 257/E21.548, E21.645
See application file for complete search history.

(56) References Cited

U.S. PATENT DOCUMENTS

| | | | |
|---|---|---|---|
| 6,235,589 B1 * | 5/2001 | Meguro | ...................... 438/267 |
| 6,555,427 B1 | 4/2003 | Shimizu et al. | |
| 6,649,965 B2 | 11/2003 | Takada et al. | |
| 7,037,784 B1 * | 5/2006 | Hong | .......................... 438/257 |
| 2004/0087106 A1 * | 5/2004 | Kim | ............................. 438/424 |
| 2004/0132305 A1 | 7/2004 | Nishimoto et al. | |
| 2005/0106874 A1 | 5/2005 | Matsui et al. | |
| 2006/0234448 A1 * | 10/2006 | Yonehama et al. | .......... 438/257 |
| 2006/0258076 A1 | 11/2006 | Mizushima et al. | |

FOREIGN PATENT DOCUMENTS

JP   2005-109452   4/2005

OTHER PUBLICATIONS

Hirasawa et al., "Methods for Manufacturing Semiconductor Devices", U.S. Appl. No. 11/594,726, filed Nov. 9, 2006.

* cited by examiner

*Primary Examiner*—Scott B. Geyer
*Assistant Examiner*—Mohsen Ahmadi
(74) *Attorney, Agent, or Firm*—Finnegan, Henderson, Farabow, Garrett & Dunner, L.L.P.

(57) ABSTRACT

A method for manufacturing a semiconductor device is provided. The method includes successively forming a first silicon film and a mask film above a semiconductor substrate through a gate insulating film, forming a plurality of trenches in the first silicon film and in the mask film to a depth to reach the semiconductor substrate, filling the plurality of trenches with the silicon oxide film, removing the mask film to expose the first silicon film existing between the silicon oxide films, selectively growing a second silicon film on the first silicon film, planarizing the second silicon film using an alkaline slurry exhibiting a pH of 13 or less and containing abrasive grains and a cationic surfactant, thereby obtaining a floating gate electrode film comprising the first and second silicon films, forming an interelectrode insulating film on the entire surface, and forming a control gate electrode film on the interelectrode insulating film.

20 Claims, 2 Drawing Sheets

METHOD FOR MANUFACTURING SEMICONDUCTOR DEVICE

CROSS-REFERENCE TO RELATED APPLICATIONS

This application is based upon and claims the benefit of priority from prior Japanese Patent Application No. 2006-082042, filed Mar. 24, 2006, the entire contents of which are incorporated herein by reference.

BACKGROUND OF THE INVENTION

1. Field of the Invention

This invention relates to a method for manufacturing a semiconductor device and, in particular, to a method for manufacturing a flash memory cell using a damascene working process.

2. Description of the Related Art

Because of the advantage of flash memory that it can retain data without necessitating the supply of power, the flash memory is widely employed as a storage element for multimedia cards. In recent years, there have been persistent demands for a flash memory having an increased capacity and hence it is now required to further enhance the integration degree of such a memory.

As one of the method for enhancing the integration degree of flash memory, there has been proposed a method of dividing the silicon layer of floating gate into two layers in fabricating a stacked gate structure. In this method, element isolation is performed after the formation of the first silicon layer, thereby enabling the second silicon layer to be deposited selectively and in a self-aligned manner only on the first silicon layer. According to this method, it is possible to make the floating gate larger than the width of tunnel insulating film and also to make the distance between neighboring floating gates smaller than the minimum line width.

It is however difficult to make uniform the surface area of the selectively grown silicon layer for every cells. As a result, the memories obtained tend to become non-uniform in characteristics due to the coupling ratio. Meanwhile, there has been proposed a damascene working process wherein the second silicon layer is non-selectively formed all over the surface of the first silicon layer and the surface of insulating layer for element isolation at first and then the second silicon layer is subjected to back etching or polishing so as to leave the second silicon layer only on the first silicon layer. Further, there has been proposed a slurry for polishing a polysilicon film that has been non-selectively grown by the ordinary LPCVD method. When a polysilicon film is mainly polished at a high polishing rate by this slurry, it is possible to inhibit the phenomena such as dishing and erosion that may be generated inside the pattern.

However, as the fineness of memory cells is further enhanced in future, it is feared that due to the existence of step portion between the first silicon layer and the insulating film for element isolation, a defective formation of the second silicon film may be generated to degrade the characteristics of the obtained device.

BRIEF SUMMARY OF THE INVENTION

A method for manufacturing a semiconductor device according to one aspect of the present invention comprises successively forming a first silicon film and a mask film above a semiconductor substrate through a gate insulating film; forming a plurality of trenches in the first silicon film and in the mask film to a depth to reach the semiconductor substrate; depositing a silicon oxide film to fill the plurality of trenches with the silicon oxide film; removing the mask film to expose the first silicon film existing between neighboring silicon oxide films buried in the plurality of trenches; selectively growing a second silicon film on the first silicon film; polishing the second silicon film using an alkaline slurry exhibiting a pH of 13 or less and containing abrasive grains and a cationic surfactant to planarize the second silicon film, thereby obtaining a floating gate electrode film comprising the first silicon film and the second silicon film; forming an interelectrode insulating film on the floating gate electrode film and on the silicon oxide film; and forming a control gate electrode film on the interelectrode insulating film.

A method for manufacturing a semiconductor device according to another aspect of the present invention comprises successively forming a first silicon film and a mask film above a semiconductor substrate through a gate insulating film; forming a plurality of trenches in the first silicon film and in the mask film to a depth to reach the semiconductor substrate; depositing a hydrophilic element-isolating insulating film exhibiting a minus surface potential to fill the plurality of trenches with the element-isolating insulating film; removing the mask film to expose the first silicon film existing between neighboring element-isolating insulating films buried in the plurality of trenches; selectively growing a second silicon film on the first silicon film; polishing the second silicon film using an alkaline slurry exhibiting a pH of 13 or less and containing abrasive grains and a cationic surfactant to planarize the second silicon film, thereby obtaining a floating gate electrode film comprising the first silicon film and the second silicon film; forming an interelectrode insulating film on the floating gate electrode film and on the element-isolating insulating film; and forming a control gate electrode film on the interelectrode insulating film.

DETAILED DESCRIPTION OF THE INVENTION

Next, embodiments of the present invention will be explained.

FIGS. 1 through 7 illustrate cross-sectional views for explaining a sequence of steps in the method for manufacturing a NAND-type flash memory according to one embodiment of the present invention.

Figure 1:
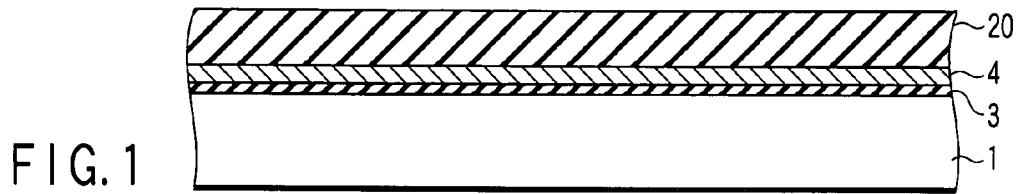
FIG. 1 is a cross-sectional view illustrating a step in the method of manufacturing a semiconductor device according one embodiment of the present invention.
Figure 2:
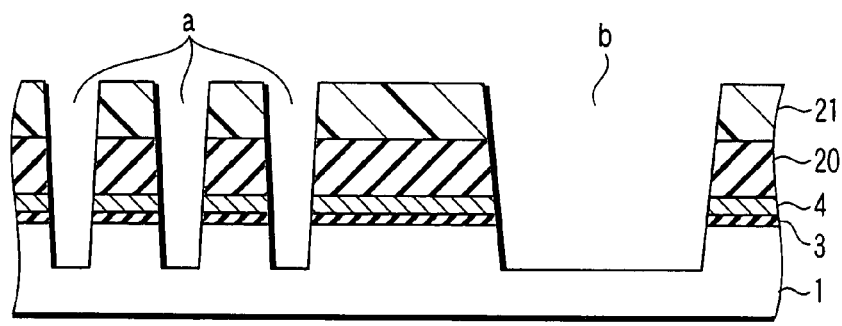
FIG. 2 is a cross-sectional view illustrating a step next to the step shown in FIG. 1.

First of all, as shown in FIG. 1, a gate insulating film 3, a first silicon film 4 and a mask film 20 are successively deposited on a silicon substrate 1. The first silicon film 4 may be formed of either polysilicon or amorphous silicon. The mask film 20 may be formed using silicon nitride, etc. Thereafter, a resist mask 21 is placed over the mask film 20 and then the patterning of an element isolation region is performed by photolithography. Specifically, by reactive ion etching (RIE), the mask film 20, the first silicon film 4, the gate insulating film 3 and the silicon substrate 1 are worked to form shallow element isolation regions "a" and "b" as shown in FIG. 2.

Figure 3:
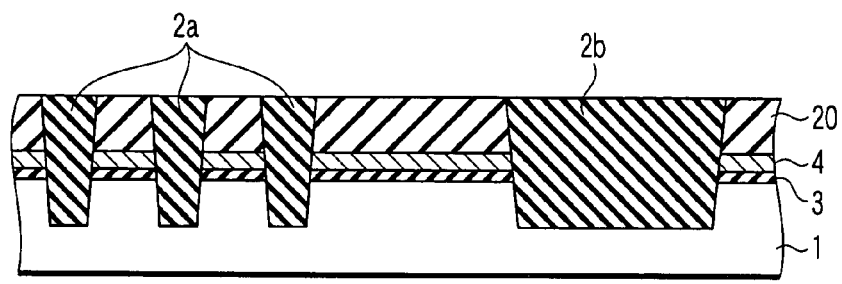
FIG. 3 is a cross-sectional view illustrating a step next to the step shown in FIG. 2.

The resist mask 21 is subsequently removed and then a silicon oxide film is deposited all over the resultant surface. Then, by CMP using the mask film 20 as a stopper, the silicon oxide film is planarized to leave the silicon oxide film buried inside the element isolation regions "a" and "b". As a result, buried element-isolating insulating films 2a and 2b are formed as shown in FIG. 3.

Figure 4:
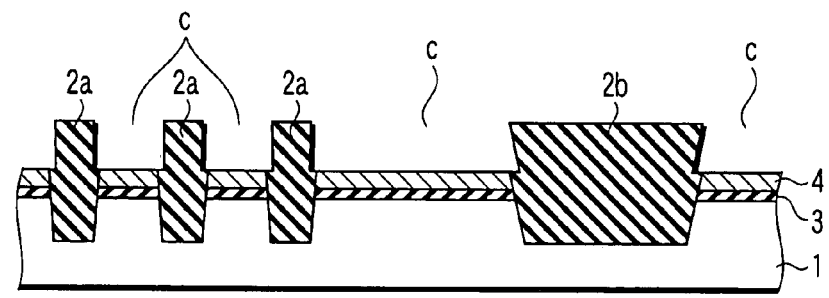
FIG. 4 is a cross-sectional view illustrating a step next to the step shown in FIG. 3.

Thereafter, the mask film 20 is removed by wet etching to expose the first silicon film 4 locating between the neighboring element-isolating insulating films 2a and 2b as shown in FIG. 4. As a result, open regions "c" defined by the first silicon film 4 acting as the bottom and by the element-isolating insulating films 2a and 2b formed of a silicon oxide film and acting as the side are created.

Figure 5:
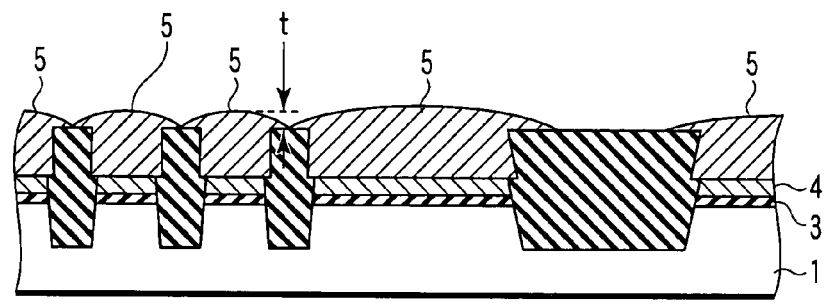
FIG. 5 is a cross-sectional view illustrating a step next to the step shown in FIG. 4.

As shown in FIG. 5, a second silicon film 5 is allowed to selectively grow in such a manner as to bury the open regions "c". As in the case of the first silicon film 4, the second silicon film 5 may be formed using either polysilicon or amorphous silicon. On executing the selective epitaxial growth of the second silicon film 5 on first silicon film 4, the native oxide layer (not shown) that has been formed on the first silicon film 4 is removed in advance. The reason is that if this native oxide layer exist on the first silicon oxide film 4, it would be impossible for the second silicon film 5 to grow on the first silicon oxide film 4. The removal of the native oxide layer can be easily realized by performing a wet etching of 5-10 nm using dilute hydrofluoric acid.

The second silicon film 5 can be formed by a process wherein the silicon substrate is heated in a vacuum chamber and then a raw material gas comprising dichlorosilane, hydrochloric acid and hydrogen gas is fed to the surface of the silicon substrate. The adjustment of the film thickness of the second silicon film 5 can be achieved by controlling the quantity of supply of the raw material gas and the film-forming time.

The second silicon film 5 is selectively grown on the first silicon film 4 such that the resultant second silicon film 5 has a convex surface as shown in FIG. 5. On this occasion, the film thickness "t" of the second silicon film 5 as measured based on the surface of the element-isolating insulating film 2a (hereinafter referred to as the quantity of overfilling) should preferably be confined within the range of 100 to 300 nm. If the quantity of overfilling exceeds 300 nm, the time required for polishing the second silicon film 5 may be prolonged, thus possibly making it difficult to inhibit the generation of necking of the silicon oxide film constituting the element-isolating insulating film 2a. On the other hand, if the quantity of overfilling is less than 100 nm, voids may be more likely to generate inside the second silicon film 5 that has been deposited in the open regions. The quantity of overfilling can be confined within a desired range by controlling the film-forming time for example.

Figure 6:
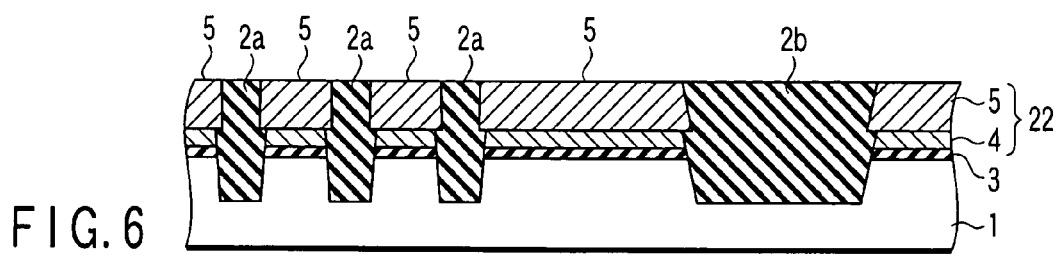
FIG. 6 is a cross-sectional view illustrating a step next to the step shown in FIG. 5.

Then, using a slurry, the second silicon film 5 is chemically and mechanically polished to planarize it as shown in FIG. 6. A floating gate electrode film 22 is constituted by a combination of the first silicon film 4 and the second silicon film 5, which are fabricated in this manner.

Figure 7:
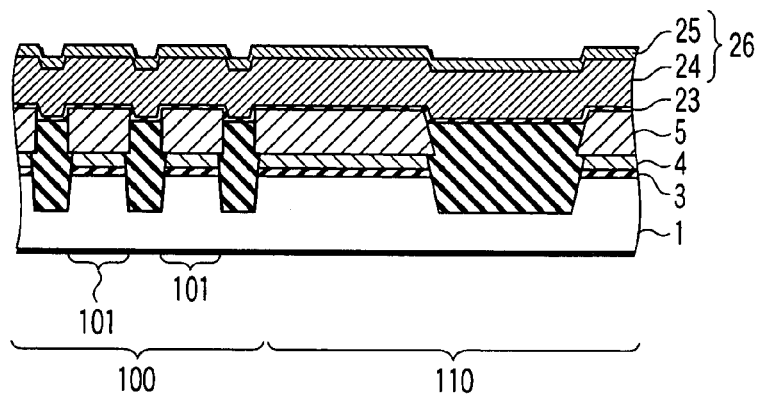
FIG. 7 is a cross-sectional view illustrating a step next to the step shown in FIG. 6.

After the level of each of the element-isolating insulating films 2a and 2b is lowered, if required, by RIE, an interelectrode insulating film 23, a P-added Si film 24 and a W film 25 are deposited all over the surface by the ordinary method as shown in FIG. 7. As for the interelectrode insulating film 23, it is possible to employ, for example, so-called ONO film consisting of a silicon oxide film/a silicon nitride film/a silicon oxide film. The stacked structure comprising the P-added Si film 24 and the W film 25 constitute a control gate electrode film 26.

Thereafter, the control gate electrode film 26 is subjected to RIE, thereby patterning word lines. On this occasion, the floating gate is divided and isolated for each memory cell. As a result, a stacked gate structure is created wherein the interelectrode insulating film 23 is sandwiched between a floating gate consisted of a stacked structure comprising the first silicon film 4 and the second silicon film 5 and a control gate consisted of a stacked structure comprising the P-added Si film 24 and the W film 25. Then, an impurity is ion-implanted in the silicon substrate 1 in self-alignment with the stacked structure thus obtained, thereby forming the source/drain regions (not shown). In this manner, it is possible to obtain a semiconductor device comprising a memory cell transistor region 100 including a memory cell transistor 101, and a peripheral circuit transistor region 110.

As described above, according to the method representing one embodiment of the present invention, the second silicon film is formed by selective growth and a specific slurry is employed for polishing this second layer of silicon film in the fabrication of the floating gate electrode film of a NAND-type flash memory. The reasons for doing so will be explained as follows.

Namely, when the planarization is performed, on forming the floating gate electrode film, on the second silicon film that has been selectively grown on the first silicon film that has been isolated by the element-isolating insulating film, "necking" may be generated at terminal portions of the pattern of the buried element-isolating insulating film.

Figure 8:
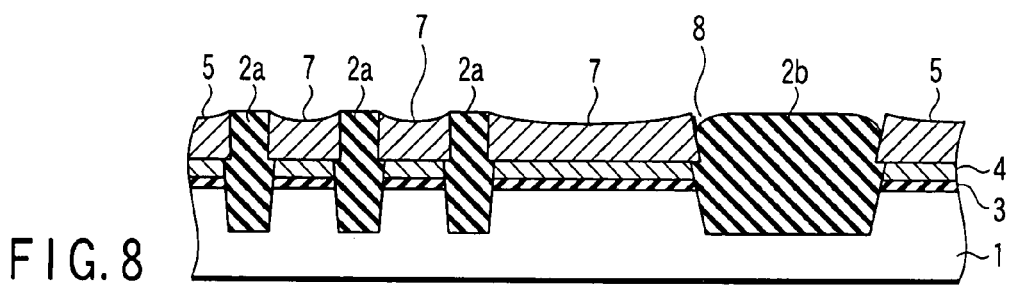
FIG. 8 is a cross-sectional view illustrating a state after planarization of the selectively grown polysilicon film.

A state where this "necking" has been generated is shown in FIG. 8. As shown in FIG. 8, the gate insulating film 3, the first silicon film 4 and the second silicon film 5 are successively deposited on the semiconductor substrate 1 wherein the isolation thereof is effected by the element-isolating insulating films 2a and 2b. The second silicon film 5 is selectively grown on the first silicon film 4 and then planarized by polishing. Since the second silicon film 5 is not existed on the element-isolating insulating films 2a and 2b, the element-isolating insulating films 2a and 2b are always left in a state of over-polishing until the polishing of this second silicon film 5 is finished.

Especially, when the element-isolating insulating films 2a and 2b are formed of a silicon oxide film, this silicon oxide film is easily erased during the polishing of the second silicon film 5, thus degrading the planarity of this silicon oxide film. As a result, a portion of the silicon oxide film located at a terminal portion of pattern is locally polished to generate erosion, thus generating a "necking"—like cross-sectional configuration 8 as shown in FIG. 8. Under some circumstances, dishing 7 may be generated on the surface of the second silicon film 5. This "necking" 8 formed at a terminal portion of pattern and prominently enlarged due to the polishing of the second silicon film 5 that has been selectively grown on the first silicon film 4 would degrade the surface planarity of the resultant device, thus giving rise to the deterioration of the characteristics of device as well as the reduction in yield of the device.

Whereas, when the second silicon film that has been non-selectively grown is polished, the generation of such a "necking" can be substantially prevented. The second silicon film that has been non-selectively grown on the first silicon film is enabled to deposit not only on the first silicon film but also on the silicon oxide film. Therefore, in the case where second silicon film that has been non-selectively grown is to be polished, the silicon oxide film is always covered by the silicon film during most of the period beginning from the start of polishing to the finish of polishing, thereby making it possible to control the polishing of the second silicon film so as to minimize the over-polishing of the silicon oxide film after the exposure of the silicon oxide film. However, when the second silicon film is directly formed, through non-selective growth, on the first silicon film and on the element-isolating insulating film, voids may leave behind in the second silicon film. This can be attributed to the fact that due to the increased fineness of memory cell, the open region where the second silicon film is to be buried is inevitably configured to have a higher aspect ratio. This void is permitted to expose from the surface of the second silicon film on planarizing the second silicon film, thus giving rise to the generation of electric defectives of the interelectrode insulating film to be subsequently formed.

In the method according to one embodiment of the present invention, a specific slurry is employed in the polishing of the second silicon film 5 that has been selectively grown, thereby making it possible to remarkably reduce or to substantially prevent the generation of the "necking" which is more likely to generate at a terminal portion of the pattern of the element-isolating insulating films 2a and 2b. As a result, the deterioration of planarity can be inhibited, thereby making it possible to overcome the deterioration of the characteristics of device as well as the reduction in yield of the device.

Next, the slurry to be employed in the polishing of the second silicon film 5 will be explained in detail. In the method according to one embodiment of the present invention, the slurry to be employed in the polishing of the second silicon film 5 comprises abrasive grains and a cationic surfactant.

The mechanism of polishing the second silicon film 5 using the aforementioned slurry will be explained with reference to FIGS. 9 and 10.

Figure 9:
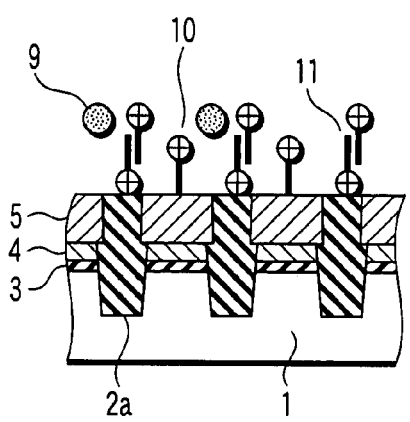
FIG. 9 is a diagram illustrating the mechanism of polishing in the region of memory cell transistor during the polishing of the second silicon film according to one embodiment of the present invention.
Figure 10:
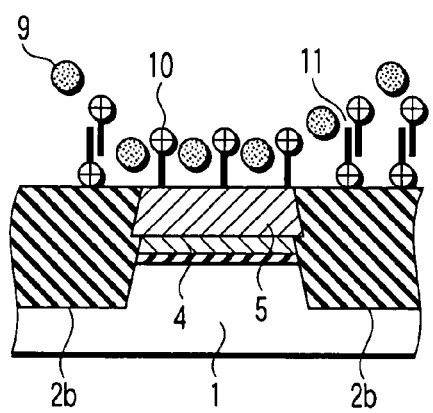
FIG. 10 is a diagram illustrating the mechanism of polishing in the region of peripheral circuit transistor during the polishing of the second silicon film according to one embodiment of the present invention.

FIG. 9 schematically shows the mechanism of polishing in the region of memory cell transistor and FIG. 10 schematically shows the mechanism of polishing in the region of peripheral circuit transistor.

On executing the polishing of the second silicon film 5 using a slurry comprising abrasive grains 9 and a cationic surfactant 10, the cationic surfactant 10 is orientated in a specific direction. Specifically, as shown in FIG. 9, the hydrophilic group of the cationic surfactant 10 adsorbs strongly to the surfaces of the element-isolating insulating films 2a and 2b both consisting of hydrophilic silicon oxide film and the hydrophobic group of the cationic surfactant 10 is orientated outward (toward the polishing pad).

Further, the hydrophobic group of the cationic surfactant 10 orientated toward the polishing pad in this manner interacts with another hydrophobic group, thus allowing the hydrophilic group to orientate toward the polishing pad, thereby creating so-called "micelle" 11. Due to the creation of this micelle, a two-ply absorption layer is formed on the surface of the element-isolating insulating films 2a and 2b and, at the same time, the hydrophilicity of the element-isolating insulating films 2a and 2b is maintained.

On the other hand, the hydrophobic group of the cationic surfactant 10 adsorbs weakly to the surface of the hydrophobic second silicon film 5, thus enabling the hydrophilic group of the cationic surfactant 10 to orientate toward the polishing pad. As a result, a single layer of adsorption layer is formed on the surface of the second silicon film 5, whereby the surface of the second silicon film 5 can be maintained in a state of hydrophilicity.

The surface of the element-isolating insulating films 2a and 2b both consisting of a silicon oxide film is protected from the attack by the abrasive grains 9 due to the existence of a two-ply protective film of the cationic surfactant 10 forming the micelle. As a result, the progress of polishing at the silicon oxide film can be prevented.

Although a single layer of adsorption layer formed of the cationic surfactant 10 is deposited on the surface of the second silicon film 5, this adsorption layer is deposited through an interaction by a weak intermolecular force between the hydrophobic second silicon film 5 and the hydrophobic group of the absorption layer. Therefore, the adsorption force of this adsorption layer is weak, thereby enabling this adsorption layer to be easily desorbed due to the presence of abrasive grains 9 or due to the roughness of the surface of polishing pad, thus allowing the polishing to proceed.

Further, since the hydrophilic group of the cationic surfactant 10 is opposite in electric potential to the electric potential (minus) of the surface of silicon oxide film, it is possible to create a stronger adsorption layer owing to the electric adsorption thereof to the surfaces of the element-isolating insulating films 2a and 2b both formed of a silicon oxide film. Further, owing to the two-ply protective film through the formation of micelle, it is possible to form a very strong protective film. The electric potential of the surface of silicon oxide film can be measured by vibrating reed method for instance.

Moreover, since the electric potential (plus) of the hydrophilic group orientated toward the polishing pad is opposite in electric potential to the zeta potential (minus) of the abrasive grains 9, the abrasive grains 9 will be attracted by the hydrophilic group, thereby making it possible to maintain a high polishing rate of the second silicon film 5. The zeta potential of the abrasive grains can be measured by electrophoretic light scattering method for instance.

As a result, it is possible, through the addition of the cationic surfactant 10, to enhance the selective etching ratio between the second silicon film 5 and the element-isolating insulating films 2a and 2b both formed of silicon oxide film, thereby enabling the second silicon film 5 to be rapidly planarized by the effect of the abrasive grains 9. On the other hand, since the element-isolating insulating films 2a and 2b are protected by the strong two-ply protective film, they cannot be substantially polished even if the polishing is excessively performed. As a result, it is possible to inhibit the generation of "necking" that is prone to generate at a terminal portion of pattern and hence it is now possible to realize excellent planarity.

In order to sufficiently secure these effects of the cationic surfactant 10, it is preferable that the surfactant is selected from those which are capable of exhibiting sufficiently high hydrophilicity while enabling the hydrophobic group thereof to adsorb to the silicon film. Specifically, the HLB value of the surfactant should preferably be 7 or more. It should be noted that the HLB value described herein is based on Griffin's formula (HLB=20×(wt % of hydrophilic group)). Namely, at the silicon oxide film located at a terminal portion of pattern, the hydrophilicity of the surfactant tends to be dragged and offset by the hydrophobicity of the second silicon film 5. Therefore, if the hydrophilicity of the cationic surfactant 10 is relatively low, it would become impossible for the hydrophilic group of the cationic surfactant 10 to adsorb onto a terminal portion of pattern of the silicon oxide film and hence, it may not be possible to secure sufficient protective effects. Additionally, if the hydrophobicity of the surfactant is high, dusts may easily adsorb onto the surface thereof, thus increasing the generation of surface defectives.

As for the abrasive grains which are a first component to be included in the slurry to be employed in the method according to one embodiment of the present invention, it is possible to employ silica, ceria, alumina, titania, zirconia, manganese dioxide, etc.

As for the silica or ceria, it is possible to employ fumed silica or fumed ceria, which can be manufactured by fumed method. Further, it is also possible to employ colloidal silica or colloidal ceria, which can be manufactured metal alkoxide by sol-gel method.

The primary particle diameter of the abrasive grains should preferably be confined within the range of 1 to 1000 nm, more preferably within the range of 3 to 100 nm. If the primary particle diameter of the abrasive grains is less than 1 nm, the polishing force of silicon may become insufficient, thus making it difficult to secure a sufficiently large polishing rate. On the other hand, if the primary particle diameter of the abrasive grains exceeds 1000 nm, it may become difficult to secure a sufficiently large selective etching ratio between the silicon film and the silicon oxide film. Further, the secondary particle diameter of the abrasive grains should preferably be confined within the range of 10 to 10000 nm, more preferably within the range of 30 to 1000 nm. If the secondary particle diameter of the abrasive grains is less than 10 nm, the polishing force of silicon may become insufficient, thus possibly lowering the polishing rate of the silicon film. On the other hand, if the secondary particle diameter of the abrasive grains exceeds 10000 nm, scratches may be generated on the resultant surface after polishing and moreover, the surface planarity may be degraded.

The concentration of the abrasive grains in the slurry should preferably be confined within the range of 0.001 to 30 wt %. If the concentration of the abrasive grains is less than 0.001 wt %, the polishing force of silicon may become insufficient, thus possibly lowering the polishing rate of the silicon film. On the other hand, if the concentration of the abrasive grains exceeds 30 wt %, scratches may be generated on the resultant surface after polishing and moreover, it may become difficult to secure a sufficiently large selective etching ratio between the silicon film and the silicon oxide film. The concentration of the abrasive grains in the slurry should more preferably be confined within the range of 0.1 to 10 wt %.

As for the cationic surfactant to be included, as a second component, in the slurry to be employed in the method according to one embodiment of the present invention, it is possible to employ quaternary ammonium salt and alkyl amine salt.

As for examples of the quaternary ammonium salt, they include lauryl trimethyl ammonium chloride, stearyl trimethyl ammonium chloride, cetyl trimethyl ammonium chloride, distearyl dimethyl ammonium chloride and alkylbenzyl dimethyl ammonium chloride.

As for examples of the alkyl amine salt, they include polyoxyethylene alkylamine and alkylamine acetate.

The concentration of the cationic surfactant in the slurry should preferably be confined within the range of 0.001 to 10 wt %. If the concentration of the cationic surfactant is less than 0.001 wt %, the effect of adsorption by the surfactant would become insufficient because of too small quantity of the surfactant, so that it would be difficult to sufficiently inhibit the generation of necking. On the other hand, if the concentration of the cationic surfactant exceeds 10 wt %, the adsorption of the surfactant to the surface of silicon film would become too strong, thereby possibly degrading the polishing rate of the silicon film. The concentration of the cationic surfactant in the slurry should more preferably be confined within the range of 0.005 to 1 wt %, most preferably within the range of 0.01 to 0.5 wt %.

The slurry to be employed for polishing the second silicon film according to one embodiment of the present invention can be obtained by adding water to the aforementioned components. As for examples of water, they include ion exchanged water and pure water.

The pH of the slurry to be employed according to one embodiment of the present invention is adjusted to an alkaline region of 13 or less. If the pH of the slurry is 7 or less, the zeta potential of the slurry would become nearly zero, thereby degrading the dispersibility of abrasive grains and hence making it impossible to polish the silicon film at a practical rate. On the other hand, if the pH of the slurry exceeds 13, it may become difficult to obtain a sufficiently high selective etching ratio between the silicon film and the silicon oxide film and additionally, the abrasive grains may dissolve.

The pH of the slurry can be adjusted to an alkaline region of 13 or less by the addition of a pH adjustor including, for example, an inorganic alkaline material such as ammonia, potassium hydroxide, etc.; an organic amine such as triethanol amine, piperazine, etc.; and an organic alkaline material such as tetramethyl ammonium hydroxide (TMAH). These pH adjustors may be incorporated into the slurry at a concentration ranging from 0.0001 to 1 wt % in order to control the pH of slurry to the aforementioned range.

The slurry may further contain a water-soluble polymer. Examples of the water-soluble polymer include, for example, cellulose such as methyl cellulose, methylhydroxyethyl cellulose, methylhydroxypropyl cellulose, hydroxyethyl cellulose, hydroxypropyl cellulose, carboxymethyl cellulose, carboxyethyl cellulose and carboxymethyl hydroxyethyl cellulose; and polysaccharide such as chitosan. It is also possible to employ, as a water-soluble polymer, polyethylene glycol, polyethylene imine, polyvinyl pyrrolidone, polyvinyl alcohol, polyacrylic acid and salts thereof, polyacryl amide and polyethylene oxide. These water-soluble polymers may be employed singly or in combination of two or more kinds.

The water-soluble polymer functions as a protective agent for the silicon oxide film in the element isolation region, i.e., as an erosion inhibitor. Because of this, when the water-soluble polymer is incorporated in the slurry, the surface planarity of device can be further enhanced.

Preferably, the weight average molecular weight of the water-soluble polymer should be confined within the range of 500 to 1,000,000. If the weight average molecular weight of the water-soluble polymer is less than 500, the effect thereof to protect the silicon oxide film cannot be sufficiently exhibited. On the other hand, if the weight average molecular weight of the water-soluble polymer exceeds 1,000,000, the effect of adsorption thereof to the surface of silicon film would become too strong, thereby possibly degrading the polishing rate of the silicon film. Furthermore, if the weight average molecular weight of the water-soluble polymer exceeds 1,000,000, the viscosity of the slurry would become too high, thus making it difficult to smoothly feed the slurry. More preferably, the weight average molecular weight of the water-soluble polymer should be confined within the range of 1,000 to 500,000, most preferably within the range of 5,000 to 300,000.

If this water-soluble polymer is incorporated into the slurry at a concentration ranging from 0.001 to 10 wt %, the effects of water-soluble polymer can be attained without permitting the water-soluble polymer to adsorb excessively to the surface of silicon film or without greatly degrading the polishing rate of silicon film. More preferably, the concentration of this water-soluble polymer should be confined within the range of 0.01 to 1 wt %, most preferably within the range of 0.05 to 0.5 wt %.

Next, examples of the present invention will be explained. First of all, the slurries to be employed herein were prepared according to the following recipe.

(Slurry No. 1)

Colloidal silica having a primary particle diameter of 50 nm was dispersed, as abrasive grains, in pure water at a concentration of 0.56 wt % to obtain a dispersion. Then, 0.1 wt % of piperazine and 0.5 wt % of triethanol amine were added, as a pH adjustor, to the dispersion. Furthermore, hydroxyethyl cellulose was added, as a water-soluble polymer, to the resultant mixture at a concentration of 0.03 wt %. Finally, lauryltrimethyl ammonium chloride was added, as a cationic surfactant, to the resultant mixture at a concentration of 0.06 wt % to obtain Slurry No. 1. It should be noted that the pH of the slurry was adjusted to 9.

(Slurry No. 2)

Slurry No. 2 was prepared by repeating the same procedures as described in the case of Slurry No. 1 except that the cationic surfactant was changed to alkylamine acetate (0.06 wt % in concentration). It should be noted that the pH of the slurry was adjusted to 9.

(Slurry No. 3)

Slurry No. 3 was prepared by repeating the same procedures as described in the case of Slurry No. 1 except that the water-soluble polymer was changed to polyvinyl alcohol (0.06 wt % in concentration). It should be noted that the pH of the slurry was adjusted to 9.

(Slurry No. 4)

Fumed ceria having a primary particle diameter of 30 nm was dispersed, as abrasive grains, in pure water at a concentration of 0.5 wt % to obtain a dispersion. Then, ammonia was added, as a pH adjustor, to the dispersion. Finally, lauryltrimethyl ammonium chloride was added, as a cationic surfactant, to the resultant mixture at a concentration of 0.06 wt % to obtain Slurry No. 4. It should be noted that the pH of the slurry was adjusted to 8.

(Slurry No. 5)

Slurry No. 5 was prepared by repeating the same procedures as described in the case of Slurry No. 1 except that the pH adjustor was changed to TMAH and that the pH was adjusted to 13.

(Slurry No. 6)

Slurry No. 6 was prepared by repeating the same procedures as described in the case of Slurry No. 1 except that the water-soluble polymer was not incorporated therein.

(Slurry No. 7)

Slurry No. 7 was prepared by repeating the same procedures as described in the case of Slurry No. 1 except that the surfactant was not incorporated therein.

(Slurry No. 8)

Slurry No. 8 was prepared by repeating the same procedures as described in the case of Slurry No. 1 except that potassium dodecylbenzene sulfonate which was an anionic surfactant was substituted for the cationic surfactant.

(Slurry No. 9)

Slurry No. 9 was prepared by repeating the same procedures as described in the case of Slurry No. 1 except that acetylene diol-based nonionic surfactant which was a nonionic surfactant was substituted for the cationic surfactant.

(Slurry No. 10)

Slurry No. 10 was prepared by repeating the same procedures as described in the case of Slurry No. 4 except that the surfactant was not incorporated therein.

(Slurry No. 11)

Slurry No. 11 was prepared by repeating the same procedures as described in the case of Slurry No. 1 except that the pH adjustor was changed to nitric acid and that the pH was adjusted to 7.

(Slurry No. 12)

Slurry No. 12 was prepared by repeating the same procedures as described in the case of Slurry No. 1 except that the pH adjustor was changed to potassium hydroxide and that the pH was adjusted to 14.

Using Slurries Nos. 1-12 which were prepared as described above, the polishing rates of a polysilicon film and a silicon oxide film were investigated. A silicon substrate having a solid film of polysilicon formed thereon and another silicon substrate having a solid film of silicon oxide were prepared. An apparatus "EPO-222" (Ebara Seisakusho Co., Ltd.) was employed as a CMP apparatus and a pad "IC1000/Suba400" (Nitta Harth Co., Ltd.) was employed as a polishing pad.

The polishing was performed as follows. While a turntable having a polishing pad attached thereon was continued to rotate at a speed of 50 rpm, a top ring holding a silicon substrate and being rotated at a speed of 55 rpm was contacted with the polishing pad at a pressure of 300 gf/cm2. The slurry was fed to the polishing pad 21 at a flow rate of 320 cc/min, thus performing the polishing for 100 seconds.

The polishing rates of the polysilicon film and the silicon oxide film in each of these slurries are summarized together with the components of slurries in the following Tables 1 and 2.

TABLE 1

|  | Slurry No. | | | | | |
|---|---|---|---|---|---|---|
|  | 1 | 2 | 3 | 4 | 5 | 6 |
| Abrasive grains | Silica | Silica | Silica | Ceria | Silica | Silica |
| pH adjustor | Piperazine Triethanol amine | Piperazine Triethanol amine | Piperazine Triethanol amine | Ammonia | TMAH | Piperazine Triethanol amine |
| Surfactant | Lauryltrimethyl ammonium chloride | Alkylamine acetate | stearyl trimethyl ammnonium chloride | Lauryltrimethyl ammonium chloride | Lauryltrimethyl animonium chloride | Lauryltrimethyl ammnonium chloride |

TABLE 1-continued

| | | Slurry No. | | | | | |
|---|---|---|---|---|---|---|---|
| | | 1 | 2 | 3 | 4 | 5 | 6 |
| Water-soluble polymer | | Cellulose | Cellulose | Polyvinyl alcohol | — | Cellulose | — |
| Polishing rate | Polysilicon film | 138 nm/min | 124 nm/min | 155 nm/min | 138 nm/min | 200 nm/min | 150 nm/min |
| | Silicon oxide film | <1 nm/min | <1 nm/min | <1 nm/min | <1 nm/min | 5 nm/min | 2 nm/min |

TABLE 2

| | | Slurry No. | | | | | |
|---|---|---|---|---|---|---|---|
| | | 7 | 8 | 9 | 10 | 11 | 12 |
| Abrasive grains | | Silica | Silica | Silica | Ceria | Silica | Silica |
| pH adjustor | | Piperazine Triethanol amine | Piperazine Triethanol amine | Piperazine Triethanol amine | Ammonia | Nitric acid | Potassium hydroxide |
| Surfactant | | — | Potassium dodecylbenzene sulfonate | Acetylenediol-based nonion | — | Lauryltrimethyl ammonium chloride | Lauryltrimethyl ammonium chloride |
| Water-soluble polymer | | Cellulose | Cellulose | Cellulose | — | Cellulose | Cellulose |
| Polishing rate | Polysilicon film | 130 nm/min | 93 nm/min | 21 nm/min | 114.1 nm/min | 10 nm/min | 50 nm/min |
| | Silicon oxide film | <1 nm/min | <1 nm/min | <1 nm/min | 300 nm/min | 10 nm/min | 100 nm/min |

As for the Slurries Nos. 1-6, since they contained both abrasive grains and a cationic surfactant and the pH thereof was confined within an alkaline region of pH 13 or less, they were all designed so as to be used in the method according to one embodiment of the present invention. These slurries were all exhibited the polishing performances that the polishing rate of the polysilicon film was as high as 124 nm/min or more and the polishing rate of the silicon oxide film was as low as 5 nm/min or less. It will be recognized from these results that the silicon film can be polished with a high selective etching ratio relative to the silicon oxide film.

Slurry No. 7 which contained no cationic surfactant also exhibited, as far as the polishing of a solid film was concerned, a high polishing rate of the polysilicon film and a low polishing rate of the silicon oxide film.

Slurry No. 8 which contained an anionic surfactant in place of the cationic surfactant exhibited a decreased polishing rate of 93 nm/min with respect to the polysilicon film. In the case of Slurry No. 9 which contained a nonionic surfactant in place of the cationic surfactant, the polishing rate of the polysilicon film was further decreased down to only 21 nm/min. Slurry No. 10 was the same in composition as Slurry No. 4 except that the cationic surfactant was not included in Slurry No. 10. However, even though the polishing rate of the polysilicon film was as high as 114.1 nm/min, the polishing rate of the silicon oxide film was increased to as high as 300 nm/min. Therefore, in the employment of these slurries, the silicon film cannot be polished with a high selective etching ratio relative to the silicon oxide film.

Slurry No. 11 having a pH value of 7 was found too low in polishing rate of the polysilicon film. Slurry No. 12 having a pH value of 14 was found too high in polishing rate of the silicon oxide film. Furthermore, in the cases of these slurries, since any substantial selective etching ratio could not be secured between the polysilicon film and the silicon oxide film, it was expected that even if these slurries were employed in the method according to the embodiment of the present invention, any desired effects could not be achieved.

Next, there will be explained the examples of forming the floating gate of flash memory cell wherein Slurries Nos. 1-12 were employed for polishing the second silicon film.

EXAMPLE 1

First of all, as shown in FIG. 1, a gate insulating film 3, a first silicon film 4 and a mask film 20 were successively deposited on a silicon substrate 1. The gate insulating film 3 was formed by thermal oxidation so as to have a thickness of 9 nm. The first silicon film 4 was formed of a polysilicon film which was deposited to a thickness of 40 nm by CVD method. Further, the mask film 20 was formed of a silicon nitride film which was deposited to a thickness of 150 nm by LPCVD method.

Then, a resist mask 21 was formed and, using this resist mask 21, the mask film 20, the first silicon film 4, the gate insulating film 3 and the silicon substrate 1 were successively subjected to etching work by RIE, thereby forming element-isolating insulating regions "a" and "b" as shown in FIG. 2.

The resist mask 21 was removed and then a silicon oxide film was deposited all over the resultant surface. Then, using the mask film 20 as a stopper, the silicon oxide film on this mask film 20 was removed, thereby leaving the silicon oxide film inside the element isolation regions. As a result, element-isolating insulating films 2a and 2b were formed as shown in FIG. 3.

Thereafter, the mask film 20 is removed by wet etching using phosphoric acid to expose the first silicon film 4 as shown in FIG. 4, thus forming open regions "c". The native oxide film on the surface of the first silicon film 4 was removed by dilute hydrofluoric acid.

Subsequently, by epitaxial growth, a second silicon film 5 was selectively formed on the first silicon film 4. As for the film-forming apparatus, Centura (Applied Materials Co., Ltd.) was employed. The formation of the second silicon film 5 was performed as follows. First of all, the silicon substrate was heated to 850° C. and then the hydrogen baking thereof performed for one minute under a pressure of 240 Torr. Subsequently, the temperature of the substrate was lowered down to 815° C. and then dichlorosilane, hydrochloric acid and hydrogen gas were fed to the surface of the substrate under a pressure of 52.8 Torr, under which conditions, the formation of the second silicon film was performed for 540 seconds.

As a result, the polysilicon film constituting the second silicon film 5 was selectively formed on the first silicon film 4 as shown in FIG. 5. On this occasion, the quantity of overfilling "t" was 278 nm.

The second silicon film 5 that had been selectively grown was polished using Slurry No. 1 to planarize the second silicon film 5 as shown in FIG. 6. In this case, the same kinds of the CMP apparatus and polishing pad as described above were employed with the polishing conditions being also the same as described above.

When the film thickness obtained after the polishing was measured, the magnitude of necking at a terminal portion of pattern of the element-isolating insulating film 2a was 10 nm or less. It should be noted that when the magnitude of necking is confined to about 15 nm or less, it would not substantially affect the performance of device and hence such a degree of necking is permissible.

As a result of the planarizing of the second silicon film 5, a floating gate electrode film 22 formed of a stacked structure consisting of the first silicon film 4 and the second silicon film 5 was created. On this floating gate electrode film 22 was deposited an interelectrode insulating film 23 made of an ONO film. Further, a phosphorus-added polysilicon film (P-added Si film) 24 was deposited thereon to a thickness of 100 nm and then a tungsten film (W film) 25 having a thickness of 85 nm was deposited thereon to obtain a control gate electrode film 26.

Thereafter, the control gate electrode film 26 was subjected to RIE, thereby patterning the word wire. On this occasion, the floating gate was isolated for each memory cell. As a result, a stacked gate structure was created wherein the interelectrode insulating film 23 was sandwiched between a floating gate consisted of a stacked structure comprising the first silicon film 4 and the second silicon film 5 and a control gate consisted of a stacked structure comprising the P-added Si film 24 and the W film 25. Then, an impurity was ion-implanted in the silicon substrate 1 in self-alignment with the stacked structure thus obtained, thereby forming the source/drain regions (not shown). In this manner, a memory cell transistor 101 was created and a semiconductor device equipped with a memory cell transistor region 100 and with a peripheral circuit transistor region 110 was manufactured as shown in FIG. 7.

The semiconductor device obtained in this example was constructed such that the generation of necking at a terminal portion of pattern of the element-isolating insulating film formed of a silicon oxide film was inhibited and that the planarity of the device was enhanced, thereby enabling the device to exhibit excellent characteristics. Moreover, it was found possible to prevent the deterioration of the yield thereof.

COMPARATIVE EXAMPLE 1

Under the same conditions as those of Example 1 except that Slurry No. 7 was employed substituting for the slurry employed in Example 1, the polishing of the second silicon film 5 was performed.

When the film thickness of the silicon oxide film was measured after finishing the polishing thereof, a local erosion (necking) 8 having a depth of about 20 nm was found generated at a terminal portion of the pattern of the element-isolating insulating film 2a. Furthermore, the generation of dishing 7 was recognized on the surface of the second silicon film 5.

Since Slurry No. 7 employed in this Comparative Example 1 contained no cationic surfactant, the necking 8 and dishing 7 were permitted to generate, thus degrading the surface planarity of the device. This necking 8 was generated due to the fact that the silicon film 5 was failed to grow and hence the silicon oxide film was exposed without being protected at all from the beginning of the polishing, thereby enabling the silicon oxide film to be excessively polished.

The necking 8 generated at a terminal portion of pattern would degrade the surface planarity of the device, giving rise to the decrease of yield. Further, due to the generation of dishing 7 on the surface of the silicon film 5, the non-uniformity in thickness of the silicon film would be generated within the cell. This non-uniformity in film thickness would become a cause for the deterioration of the characteristics of device.

EXAMPLE 2

Under the same conditions as those of Example 1 except that Slurry No. 2 was employed substituting for the slurry employed in Example 1, the polishing of the second silicon film 5 was performed. As a result, the magnitude of necking at a terminal portion of pattern of the element-isolating insulating film 2a was found less than 5 nm.

Thereafter, an interelectrode insulating film 23 and a control gate electrode film 26 were formed in the same manner as formed in Example 1 and then the etching and the ion implantation were performed to obtain a semiconductor device equipped with a memory cell transistor region 100 and with a peripheral circuit transistor region 110 as shown in FIG. 7.

The semiconductor device obtained in this example was constructed such that the generation of necking at a terminal portion of pattern of the element-isolating insulating film formed of a silicon oxide film was inhibited and that the planarity of the device was enhanced, thereby enabling the device to exhibit excellent characteristics. Moreover, it was found possible to prevent the deterioration of the yield thereof.

COMPARATIVE EXAMPLE 2

Under the same conditions as those of Example 1 except that Slurry No. 8 was employed substituting for the slurry employed in Example 1 and that the polishing time was changed to 300 seconds, the polishing of the second silicon film 5 was performed. As a result, the magnitude of necking at a terminal portion of pattern of the element-isolating insulating film 2a was found as large as 30 nm.

The surfactant included in Slurry No. 8 employed in this comparative example was potassium dodecylbenzene sulfonate. Since this potassium dodecylbenzene sulfonate was strong in adsorption to the hydrophobic portion of the polysilicon film, the polishing by the effect of abrasive grains was obstructed, thus decreasing the polishing rate. Moreover, since this surfactant was anionic, the electric potential of this potassium dodecylbenzene sulfonate was also minus as that of the silicon oxide film. Therefore, the adsorption force of the hydrophilic group to the silicon oxide film was weak, thus limiting the effect of protection by the surfactant.

As a result, a long polishing time of 300 seconds was required for planarizing the silicon film. Due to this long period of over-polishing time and the weak protective effect by the surfactant, the magnitude of necking was assumed to be increased ultimately.

Therefore, as in the case of Comparative Example 1, the necking generated at a terminal portion of pattern would degrade the surface planarity of the device, giving rise to the decrease of yield.

COMPARATIVE EXAMPLE 3

Under the same conditions as those of Example 1 except that Slurry No. 9 was employed substituting for the slurry employed in Example 1 and that the polishing time was changed to 300 seconds, the polishing of the second silicon film 5 was tried. As a result, the magnitude of necking at a terminal portion of pattern of the element-isolating insulating film 2a was found as large as 20 nm.

Slurry No. 9 employed in this comparative example contained acetylene diol-based nonionic surfactant. Since this acetylene diol-based nonionic surfactant was very strong in adsorption to the hydrophobic portion of the silicon film, the polishing by the effect of abrasive grains was obstructed, thus extremely decreasing the polishing rate.

As a result, a long polishing time of 300 seconds was required for planarizing the silicon film. Due to this long period of over-polishing time, the protective effect by the surfactant vanished, thus making it impossible to inhibit the generation of necking.

Therefore, as in the case of Comparative Example 1, the necking generated at a terminal portion of pattern would degrade the surface planarity of the device, giving rise to the decrease of yield.

EXAMPLE 3

Under the same conditions as those of Example 1 except that Slurry No. 3 was employed substituting for the slurry employed in Example 1, the polishing of the second silicon film 5 was performed. As a result, the magnitude of necking at a terminal portion of pattern of the element-isolating insulating film 2a was suppressed to less than 5 nm.

Thereafter, an interelectrode insulating film 23 and a control gate electrode film 26 were formed in the same manner as formed in Example 1 and then the etching and the ion implantation were performed to obtain a semiconductor device equipped with a memory cell transistor region 100 and with a peripheral circuit transistor region 110 as shown in FIG. 7.

The semiconductor device obtained in this example was constructed such that the generation of necking at a terminal portion of pattern of the element-isolating insulating film formed of a silicon oxide film was inhibited and that the planarity of the device was enhanced, thereby enabling the device to exhibit excellent characteristics. Moreover, it was found possible to prevent the deterioration of the yield thereof.

EXAMPLE 4

Under the same conditions as those of Example 1 except that Slurry No. 4 was employed substituting for the slurry employed in Example 1, the polishing of the second silicon film 5 was performed. As a result, the magnitude of necking at a terminal portion of pattern of the element-isolating insulating film 2a was suppressed to less than 10 nm.

Thereafter, an interelectrode insulating film 23 and a control gate electrode film 26 were formed in the same manner as formed in Example 1 and then the etching and the ion implantation were performed to obtain a semiconductor device equipped with a memory cell transistor region 100 and with a peripheral circuit transistor region 110 as shown in FIG. 7.

The semiconductor device obtained in this example was constructed such that the generation of necking at a terminal portion of pattern of the element-isolating insulating film formed of a silicon oxide film was inhibited and that the planarity of the device was enhanced, thereby enabling the device to exhibit excellent characteristics. Moreover, it was found possible to prevent the deterioration of the yield thereof.

COMPARATIVE EXAMPLE 4

Under the same conditions as those of Example 1 except that Slurry No. 10 was employed substituting for the slurry employed in Example 1, the polishing of the second silicon film 5 was tried. As a result, a necking having a size of as large as more than 100 nm was generated at a terminal portion of pattern of the element-isolating insulating film 2a.

Slurry No. 10 employed in this comparative example was of the same composition as Slurry No. 4 employed in Example 4 except that the cationic surfactant was not included therein. Not only Slurry No. 4 but also Slurry No. 10 contained ceria particles as abrasive grains. When ceria particles are included in a slurry, a silicon film can be polished at a polishing rate of 100 nm/min or more. However, if a surfactant is not included in a slurry, a silicon oxide film can be polished at a polishing rate of as large as 300 nm/min as indicated by the results of Slurry No. 10. This phenomenon will be attributed to the cooperative reaction between cerium and silicon as explained below. Namely, since cerium and silicon are both tetravalent, a chemical interaction such as the delivery of electrons is generated between the ceria and the silicon oxide film. As a result, the polishing of the silicon oxide film by the ceria particles is caused to proceed.

If a surfactant is included together with ceria particles in the slurry, the polishing of silicon oxide film can be inhibited, thereby enabling to obtain a sufficient selective etching ratio between the silicon film and the silicon oxide film.

As for the surfactant useful in this case, a cationic surfactant can be suitably employed. Namely, as described above, the hydrophilic group of surfactant exhibiting a plus potential is enabled to electrically strongly adsorb onto the surface of silicon oxide film exhibiting a minus potential, thereby forming micelle on the surface of the silicon oxide film. As a result, a two-ply protective film is formed to protect the silicon oxide film from the ceria particles.

COMPARATIVE EXAMPLE 5

Under the same conditions as those of Example 1 except that Slurry No. 11 was employed substituting for the slurry employed in Example 1 and that the polishing time was changed to 360 seconds, the polishing of the second silicon film 5 was tried. As a result, a necking having a size of as large as more than 100 nm was generated at a terminal portion of pattern of the element-isolating insulating film 2a.

Since Slurry No. 11 employed in this comparative example had a pH value of 7, the polishing rate of the silicon film was extremely lowered. As a result, a long polishing time of 360 seconds was required for polishing the silicon film. Due to this long period of over-polishing time, the protective effect by the surfactant vanished, thus making it impossible to inhibit the generation of necking.

Therefore, as in the case of Comparative Example 1, the necking generated at a terminal portion of pattern would degrade the surface planarity of the device, giving rise to the decrease of yield.

COMPARATIVE EXAMPLE 6

Under the same conditions as those of Example 1 except that Slurry No. 12 was employed substituting for the slurry employed in Example 1, the polishing of the second silicon film 5 was tried. As a result, a necking having a size of as large as more than 100 nm was generated at a terminal portion of pattern of the element-isolating insulating film 2a.

Since slurry No. 12 employed in this comparative example had a pH value of 14, it was impossible to secure a sufficient selective etching ratio between the silicon film and the silicon oxide film, thus making it impossible to inhibit the generation of necking.

Therefore, as in the case of Comparative Example 1, the necking generated at a terminal portion of pattern would degrade the surface planarity of the device, giving rise to the decrease of yield.

EXAMPLE 5

Under the same conditions as those of Example 1 except that the film-forming time of the second silicon film 5 was shortened to 345 seconds so as to alter the quantity of overfilling to 178 nm, the polishing of the second silicon film 5 was performed. It should be noted that due to the reduction of the quantity of overfilling, the polishing time of the second silicon film 5 was shortened to 80 seconds.

As a result, the magnitude of necking at a terminal portion of pattern of the element-isolating insulating film 2a was suppressed to less than 1 nm. This result can be attributed to the fact that due to the reduction of polishing time, the period of time in which the silicon oxide film was exposed to the polishing was reduced.

EXAMPLE 6

Under the same conditions as those of Example 1 except that Slurry No. 5 was employed substituting for the slurry employed in Example 1, the polishing of the second silicon film 5 was performed. As a result, the magnitude of necking at a terminal portion of pattern of the element-isolating insulating film 2a was suppressed to not more than 12 nm.

Thereafter, an interelectrode insulating film 23 and a control gate electrode film 26 were formed in the same manner as formed in Example 1 and then the etching and the ion implantation were performed to obtain a semiconductor device equipped with a memory cell transistor region 100 and with a peripheral circuit transistor region 110 as shown in FIG. 7.

The semiconductor device obtained in this example was constructed such that the generation of necking at a terminal portion of pattern of the element-isolating insulating film formed of a silicon oxide film was inhibited and that the planarity of the device was enhanced, thereby enabling the device to exhibit excellent characteristics. Moreover, it was found possible to prevent the deterioration of the yield thereof.

EXAMPLE 7

Under the same conditions as those of Example 1 except that Slurry No. 6 was employed substituting for the slurry employed in Example 1, the polishing of the second silicon film 5 was performed. As a result, the magnitude of necking at a terminal portion of pattern of the element-isolating insulating film 2a was suppressed to about 15 nm.

Thereafter, an interelectrode insulating film 23 and a control gate electrode film 26 were formed in the same manner as formed in Example 1 and then the etching and the ion implantation were performed to obtain a semiconductor device equipped with a memory cell transistor region 100 and with a peripheral circuit transistor region 110 as shown in FIG. 7.

The semiconductor device obtained in this example was constructed such that the generation of necking at a terminal portion of pattern of the element-isolating insulating film formed of a silicon oxide film was inhibited and that the planarity of the device was enhanced, thereby enabling the device to exhibit excellent characteristics. Moreover, it was found possible to prevent the deterioration of the yield thereof.

The quantity of overfilling and the magnitude of necking obtained in the aforementioned Examples and Comparative Examples are summarized together with the slurries employed therein in the following Tables 3 and 4.

TABLE 3

| | Examples | | | | | | |
|---|---|---|---|---|---|---|---|
| | 1 | 2 | 3 | 4 | 5 | 6 | 7 |
| Quantity of overfilling | 278 nm | 278 nm | 278 nm | 278 nm | 178 nm | 278 nm | 278 nm |
| CMP slurry | No. 1 | No. 2 | No. 3 | No. 4 | No. 1 | No. 5 | No. 6 |
| Magnitude of necking | ≦10 nm | <5 nm | <5 nm | <10 nm | <1 nm | ≦12 nm | ≦15 nm |

TABLE 4

| | Comparative Examples | | | | | |
|---|---|---|---|---|---|---|
| | 1 | 2 | 3 | 4 | 5 | 6 |
| Quantity of overfilling | 278 nm | 278 nm | 278 nm | 278 nm | 278 nm | 278 nm |
| CMP slurry | No. 7 | No. 8 | No. 9 | No. 10 | No. 11 | No. 12 |
| Magnitude of necking | 20 nm | 30 nm | 20 nm | >100 nm | >100 nm | >100 nm |

As shown in above Table 3, in the cases where slurries containing abrasive grains and a cationic surfactant and exhibiting a pH value confined within a predetermined range are employed (Examples 1-7), it is possible to limit the magnitude of necking at a terminal portion of pattern to 15 nm or less. Especially, in the case where the quantity of overfilling is reduced to 178 nm as in the case of Example 5, it is possible to substantially prevent the generation of necking. Moreover, since a silicon film is enabled to be polished at a high selective polishing ratio relative to a silicon oxide film, it is possible to manufacture a flash memory device excellent in characteristics at a high yield.

Whereas, in the cases of slurries where predetermined components are not included therein or the pH thereof is not confined within the predetermined range, even if the polishing is performed under the same conditions, it is impossible to suppress the magnitude of necking at a terminal portion of pattern as shown in Comparative Examples 1-6. Moreover, since a silicon film cannot be polished at a high selective polishing ratio relative to a silicon oxide film, it will lead to the deterioration of the characteristics of device and also to the decrease of yield.

The present invention should not be construed to be limited to the aforementioned embodiments. Namely, these embodiments can be variously modified without departing from the scope of the present invention.

According to the embodiments of the present invention, there are proposed a semiconductor device comprising a stacked structure exhibiting excellent characteristics as well as a method of manufacturing such a semiconductor device at a high yield.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device comprising:

successively forming a first silicon film and a mask film above a semiconductor substrate through a gate insulating film;

forming a plurality of trenches in the first silicon film and in the mask film to a depth to reach the semiconductor substrate;

depositing a silicon oxide film to fill the plurality of trenches with the silicon oxide film;

removing the mask film to expose the first silicon film existing between neighboring silicon oxide films buried in the plurality of trenches;

selectively growing a second silicon film on the first silicon film;

polishing the second silicon film using an alkaline slurry exhibiting a pH of 13 or less and containing abrasive grains and a cationic surfactant to planarize the second silicon film, thereby obtaining a floating gate electrode film comprising the first silicon film and the second silicon film;

forming an interelectrode insulating film on the floating gate electrode film and on the silicon oxide film; and forming a control gate electrode film on the interelectrode insulating film.

2. The method according to claim 1, wherein the first silicon film is formed using polysilicon or amorphous silicon.

3. The method according to claim 1, wherein the first silicon film has a native oxide layer on a surface, and further comprising wet-etching the native oxide film prior to selectively growing the second silicon film on the first silicon film.

4. The method according to claim 1, wherein the second silicon film is formed using polysilicon or amorphous silicon.

5. The method according to claim 1, wherein the selectively growing the second silicon film on the first silicon film is performed feeding a raw material gas comprising dichlorosilane, hydrochloric acid and hydrogen gas to a vacuum chamber after heating the semiconductor substrate placed in the vacuum chamber.

6. The method according to claim 1, wherein the second silicon film is selectively grown on the first silicon film to 100 to 300 nm in quantity of overfilling as measured based on a surface of the silicon oxide film.

7. The method according to claim 1, further comprising lowering a level of a top surface of the silicon oxide film than a level of a top surface of the floating gate electrode film prior to forming the interelectrode insulating film.

8. The method according to claim 1, wherein the abrasive grains included in the slurry are formed of silica or ceria.

9. The method according to claim 1, wherein the abrasive grains included in the slurry has a primary diameter within a range of 1 to 1000 nm.

10. The method according to claim 1, wherein the abrasive grains are included in the slurry at a concentration ranging from 0.001 to 30 wt %.

11. The method according to claim 1, wherein the cationic surfactant included in the slurry has an HLB value of 7 or more.

12. The method according to claim 1, wherein the cationic surfactant included in the slurry is selected from quaternary ammonium salt and alkyl amine salt.

13. The method according to claim 12, wherein the quaternary ammonium salt is selected from the group consisting of lauryl trimethyl ammonium chloride, stearyl trimethyl ammonium chloride, cetyl trimethyl ammonium chloride, distearyl dimethyl ammonium chloride and alkylbenzyl dimethyl ammonium chloride.

14. The method according to claim 12, wherein the alkyl amine salt is selected from the group consisting of polyoxyethylene alkylamine and alkylamine acetate.

15. The method according to claim 1, wherein the cationic surfactant is included in the slurry at a concentration ranging from 0.001 to 10 wt %.

16. The method according to claim 1, wherein the slurry exhibits a silicon film-polishing rate of 124 nm/mm or more and a silicon oxide film-polishing rate of 5 nm/mm or less.

17. The method according to claim 1, wherein the slurry further comprises a water-soluble polymer.

18. The method according to claim 17, wherein the water-soluble polymer is selected from the group consisting of methyl cellulose, methylhydroxyethyl cellulose, methylhydroxypropyl cellulose, hydroxyethyl cellulose, hydroxypropyl cellulose, carboxymethyl cellulose, carboxyethyl cellulose, carboxymethyl hydroxyethyl cellulose, chitosan, polyethylene glycol, polyethylene imine, polyvinyl pyrrolidone, polyvinyl alcohol, polyacrylic acid and salts thereof, polyacryl amide and polyethylene oxide.

19. A method for manufacturing a semiconductor device comprising:

successively forming a first silicon film and a mask film above a semiconductor substrate through a gate insulating film;

forming a plurality of trenches in the first silicon film and in the mask film to a depth to reach the semiconductor substrate;

depositing a hydrophilic element-isolating insulating film exhibiting a minus surface potential to fill the plurality of trenches with the element-isolating insulating film;

removing the mask film to expose the first silicon film existing between neighboring element-isolating insulating films buried in the plurality of trenches;

selectively growing a second silicon film on the first silicon film;

polishing the second silicon film using an alkaline slurry exhibiting a pH of 13 or less and containing abrasive grains and a cationic surfactant to planarize the second silicon film, thereby obtaining a floating gate electrode film comprising the first silicon film and the second silicon film;

forming an interelectrode insulating film on the floating gate electrode film and on the element-isolating insulating film; and forming a control gate electrode film on the interelectrode insulating film.

20. The method according to claim 19, wherein the abrasive grains exhibit a zeta potential of minus.

* * * * *